(12) United States Patent
Miyanami

(10) Patent No.: US 9,812,481 B2
(45) Date of Patent: *Nov. 7, 2017

(54) SOLID-STATE IMAGING DEVICE AND MANUFACTURING METHOD OF THE SAME, AND ELECTRONIC APPARATUS

(71) Applicant: SONY CORPORATION, Tokyo (JP)

(72) Inventor: Yuki Miyanami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/257,665

(22) Filed: Sep. 6, 2016

(65) Prior Publication Data

US 2016/0372508 A1    Dec. 22, 2016

Related U.S. Application Data

(63) Continuation of application No. 15/085,305, filed on Mar. 30, 2016, now Pat. No. 9,461,085, which is a
(Continued)

(30) Foreign Application Priority Data

Jan. 23, 2012   (JP) ................................ 2012-011125

(51) Int. Cl.
*H01L 27/146* (2006.01)
*H04N 5/357* (2011.01)
(Continued)

(52) U.S. Cl.
CPC .... *H01L 27/14623* (2013.01); *H01L 27/1462* (2013.01); *H01L 27/1463* (2013.01);
(Continued)

(58) Field of Classification Search
CPC ........... H01L 27/14623; H01L 27/1463; H01L 27/1464
See application file for complete search history.

(56) References Cited

U.S. PATENT DOCUMENTS 7,285,438 B2 * 10/2007 Kasuga ............. H01L 27/14843
257/E27.151
9,461,085 B2 * 10/2016 Miyanami ......... H01L 27/14623

FOREIGN PATENT DOCUMENTS

| CN | 101800233 A | 8/2010 |
|----|-------------|--------|
| JP | H05235319 A | 9/1993 |

(Continued)

OTHER PUBLICATIONS

Official Action (with English translation) for Korean Patent Application No. 10-2014-7019200 mailed Dec. 5, 2016, 13 pages.
(Continued)

*Primary Examiner* — Daniel Shook
(74) *Attorney, Agent, or Firm* — Sheridan Ross P.C.

(57) ABSTRACT

The present disclosure relates to a solid-state imaging device and a manufacturing method of the same, and an electronic apparatus, capable of more reliably suppressing occurrence of color mixing. A trench is formed between PDs so as to be opened to a light receiving surface side of a semiconductor substrate on which a plurality of the PDs, each of which receives light to generate charges, are formed, an insulating film is embedded in the trench and the insulating film is laminated on a back surface side of the semiconductor substrate. Then, a light shielding portion is formed so as to be laminated on the insulating film and to have a convex shape protruding to the semiconductor substrate at a location corresponding to the trench. The present technology can be applied to a back surface irradiation type CMOS solid-state imaging device.

21 Claims, 13 Drawing Sheets

Related U.S. Application Data continuation of application No. 14/864,163, filed on Sep. 24, 2015, now Pat. No. 9,368,532, which is a continuation of application No. 14/720,410, filed on May 22, 2015, now Pat. No. 9,184,201, which is a continuation of application No. 14/372,413, filed as application No. PCT/JP2013/050406 on Jan. 11, 2013, now Pat. No. 9,105,539.

(51) Int. Cl.
*H04N 5/376* (2011.01)
*H04N 5/378* (2011.01)
*H04N 5/225* (2006.01)
*H04N 9/04* (2006.01)

(52) U.S. Cl.
CPC .... *H01L 27/1464* (2013.01); *H01L 27/14621* (2013.01); *H01L 27/14627* (2013.01); *H01L 27/14636* (2013.01); *H01L 27/14638* (2013.01); *H01L 27/14641* (2013.01); *H01L 27/14643* (2013.01); *H01L 27/14645* (2013.01); *H01L 27/14685* (2013.01); *H01L 27/14689* (2013.01); *H04N 5/2253* (2013.01); *H04N 5/3575* (2013.01); *H04N 5/376* (2013.01); *H04N 5/378* (2013.01); *H04N 9/04* (2013.01)

(56) References Cited

FOREIGN PATENT DOCUMENTS

| | | |
|---|---|---|
| JP | 2006-019653 | 1/2006 |
| JP | 2006019653 A | 1/2006 |
| JP | 2008-103764 | 5/2008 |
| JP | 2008103764 A | 5/2008 |
| JP | 2011-216826 | 10/2011 |
| JP | 2011216826 A | 10/2011 |
| JP | 2011-243996 | 12/2011 |
| JP | 2011243996 A | 12/2011 |

OTHER PUBLICATIONS

Office Action and English translation for Chinese Patent Application No. 201610464117.4, dated May 12, 2017, 18 pages.
Decision of Refusal and English translation for Korean Patent Application No. 10-2014-7019200, dated Apr. 25, 2017, 7 pages.
Decision of Refusal (and its English translation) for Korean Patent Application No. 10-2014-7019200, dated Aug. 3, 2017, 7 pages.

\* cited by examiner

SOLID-STATE IMAGING DEVICE AND MANUFACTURING METHOD OF THE SAME, AND ELECTRONIC APPARATUS

CROSS REFERENCE TO RELATED APPLICATIONS

This application is a continuation of U.S. patent application Ser. No. 15/085,305, filed Mar. 30, 2016, which is a continuation of U.S. patent application Ser. No. 14/864,163, filed Sep. 24, 2015, now U.S. Pat. No. 9,368,532, which is a continuation of U.S. patent application Ser. No. 14/720,410, filed May 22, 2015, now U.S. Pat. No. 9,184,201, which is a continuation of U.S. patent application Ser. No. 14/372,413, filed Jul. 15, 2014, now U.S. Pat. No. 9,105,539, which is a national stage application under 35 U.S.C. 371 and claims the benefit of PCT Application No. PCT/JP2013/050406, having an international filing date of Jan. 11, 2013, which designated the United States, which claims the benefit of Japanese Patent Application No. 2012-011125, filed Jan. 23, 2012, the entire disclosures of which are hereby incorporated herein by reference.

TECHNICAL FIELD

The present disclosure relates to a solid-state imaging device and a manufacturing method of the same, and an electronic apparatus, and in particular, to a solid-state imaging device and a manufacturing method of the same, and an electronic apparatus, capable of more reliably suppressing occurrence of color mixing.

BACKGROUND ART

In general, in a Complementary Metal Oxide Semiconductor (CMOS) type solid-state imaging device, a unit pixel is formed with a photo diode which is a light receiving unit and a plurality of transistors, and a plurality of the pixels are arranged two-dimensionally. In the CMOS type solid-state imaging device, respective electrodes of the transistors are connected to a multilayer wiring, and signal charges generated in the photo diode are read as a signal current by desired voltage pulses being applied to the electrodes of the transistors through respective wirings.

In addition, in a Charge Coupled Device (CCD) type solid-state imaging device, the signal charges generated in the photo diode pass through a charge transfer unit (a vertical CCD and a horizontal CCD) configured with CCDs and are supplied to a charge detection unit.

Further, in recent years, a back surface irradiation type imaging device has been put into practical use in which light is applied to a back surface side which is the side opposite to a front surface on which wiring layers are laminated on a device substrate in which the photo diode and the transistors are formed. In the back surface irradiation type imaging device, charges by photoelectric conversion occur most frequently in the back surface side of the device substrate. Therefore, if color mixing occurs due to leakage of electrons generated by photoelectric conversion in a vicinity of the back surface of the device substrate to adjacent pixels, a signal characteristic deteriorates, and thus suppressing the occurrence of such color mixing is important.

However, when the formation of impurities for performing element isolation between the photodiodes is performed by ion implantation from the front surface side of the device substrate and annealing, a method by high-energy implantation disclosed in PTL 1 is employed.

However, in a deep position of the back surface side far from the front surface of the device substrate to which the ion implantation is performed, ions diffuse to extend in a transverse direction. Accordingly, in a fine pixel, since an electric field in the transverse direction in the vicinity of the back surface of the device substrate is weak, it is difficult to suppress the color mixing due to the leakage of electrons generated by the photoelectric conversion to adjacent pixels.

Therefore, as disclosed in PTL 2, the present applicant has proposed a method which physically separates pixels by forming a trench on the back surface of the device substrate and suppresses the leakage of charges to adjacent pixels by embedding metal in the trench portion.

CITATION LIST

Patent Literature

PTL 1: Japanese Unexamined Patent Application Publication No. 2003-318122

PTL 2: Japanese Unexamined Patent Application Publication No. 2011-3860

SUMMARY OF INVENTION

Technical Problem

Meanwhile, in a structure disclosed in PTL 2, it is effective to form a deep trench as a method for suppressing incidence of light in an oblique direction or suppressing occurrence of shading. However, when a light shielding metal film is embedded in the deep trench which is formed, an interference characteristic deteriorates due to formation of the metal film such that noise and white spots due to a dark current occur, which results in a concern that an image quality deteriorates. Therefore, avoiding the deterioration in the image quality and suppressing the occurrence of the color mixing are required.

The present disclosure has been made in view of such circumstances, and is intended to be able to more reliably suppress occurrence of color mixing.

Solution to Problem

A solid-state imaging device according to an aspect of the present disclosure includes a semiconductor substrate on which a plurality of photoelectric conversion units, each of which receives light to generate charges, are formed; a recessed portion that is formed between the photoelectric conversion units so as to be opened to a light receiving surface side of the semiconductor substrate; an insulating film which is embedded in the recessed portion and laminated on the back surface side of the semiconductor substrate; and a light shielding portion that is laminated on the insulating film and is formed into a convex shape protruding to the semiconductor substrate at a location corresponding to the recessed portion.

A manufacturing method according to another aspect of the present disclosure includes the steps of forming a recessed portion between photoelectric conversion units so as to be opened to a light receiving surface side of a semiconductor substrate on which a plurality of the photoelectric conversion units, each of which receives light to generate charges, are formed; embedding an insulating film in the recessed portion and laminating the insulating film on a back surface side of the semiconductor substrate; and laminating a light shielding portion on the insulating film and forming the light shielding portion into a convex shape protruding to the semiconductor substrate at a location corresponding to the recessed portion.

An electronic apparatus according to still another aspect of the present disclosure includes a solid-state imaging device including a semiconductor substrate on which a plurality of photoelectric conversion units, each of which receives light to generate charges, are formed; a recessed portion that is formed between the photoelectric conversion units so as to be opened to a light receiving surface side of the semiconductor substrate; an insulating film which is embedded in the recessed portion and laminated on the back surface side of the semiconductor substrate; and a light shielding portion that is laminated on the insulating film and is formed into a convex shape protruding to the semiconductor substrate at a location corresponding to the recessed portion.

According to still another aspect of the present disclosure, a recessed portion is formed between photoelectric conversion units so as to be opened to a light receiving surface side of a semiconductor substrate on which a plurality of the photoelectric conversion units, each of which receives light to generate charges, are formed, an insulating film is embedded in the recessed portion and the insulating film is laminated on a back surface side of the semiconductor substrate. Then, a light shielding portion is laminated on the insulating film and is formed into a convex shape protruding to the semiconductor substrate at a location corresponding to the recessed portion.

Advantageous Effects of Invention

According to the aspects of the present disclosure, it is possible to more reliably suppress occurrence of color mixing.

DESCRIPTION OF EMBODIMENTS

Hereinafter, specific embodiments to which the present technology is applied will be described in detail with reference to drawings.

Figure 1:
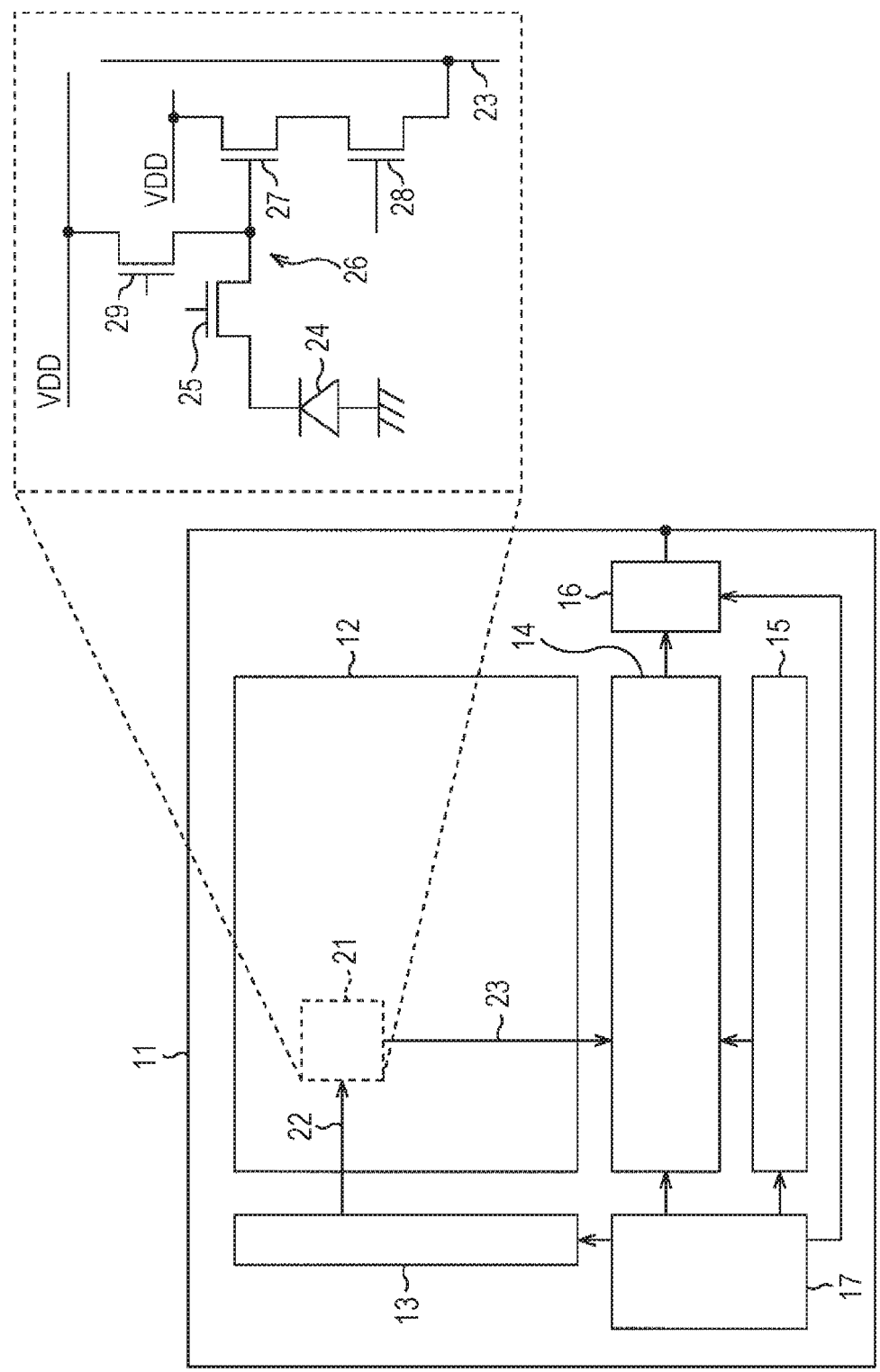
FIG. 1 is a block diagram illustrating a configuration example of an imaging device to which an embodiment of the present technology is applied.

FIG. 1 is a block diagram illustrating a configuration example of an imaging device to which an embodiment of the present technology is applied.

As illustrated in FIG. 1, an imaging device 11 is a CMOS-type solid-state imaging device, and is configured to include a pixel array unit 12, a vertical driving unit 13, a column processing unit 14, a horizontal driving unit 15, an output unit 16, and a driving control unit 17.

The pixel array unit 12 includes a plurality of pixels 21 which are arranged in an array shape, is connected to the vertical driving unit 13 through a plurality of horizontal signal lines 22 corresponding to the number of rows of the pixels 21, and is connected to the column processing unit 14 through a plurality of vertical signal lines 23 corresponding to the number of columns of the pixels 21. In other words, the plurality of pixels 21 included in the pixel array unit 12 are respectively disposed at points in which the horizontal signal lines 22 and the vertical signal lines 23 intersect.

The vertical driving unit 13 sequentially supplies drive signals (transfer signals, selection signals, reset signals, or the like) for driving respective pixels 21 to respective rows of the plurality of pixels 21 included in the pixel array unit 12 through the horizontal signal line 22.

The column processing unit 14 extracts the signal levels of the pixel signals by performing a Correlated Double Sampling (CDS) process on the pixel signals which are output from respective pixels 21 through the vertical signal line 23 and acquires pixel data corresponding to the amount of received light of the pixels 21.

The horizontal driving unit 15 sequentially supplies the column processing unit 14 with drive signals for outputting pixel data which is acquired from respective pixels 21 from the column processing unit 14 in number order, for each column of the plurality of pixels 21 included in the pixel array unit 12.

The pixel data is supplied from the column processing unit 14 to the output unit 16 at a timing corresponding to the drive signal of the horizontal driving unit 15, and the output unit 16 amplifies, for example, the pixel data and outputs the amplified pixel data to an image processing circuit in the subsequent stage.

The driving control unit 17 controls the driving of each block in the imaging device 11. For example, the driving control unit 17 generates a clock signal according to the driving period of each block and supplies the clock signal to each block.

Further, as illustrated on a right upper part of FIG. 1, the pixel 21 is configured to include a PD 24, a transfer transistor 25, an FD 26, an amplification transistor 27, a selection transistor 28, and a reset transistor 29.

The PD 24 is a photoelectric conversion unit, which receives light applied to the pixel 21 and generates charges corresponding to the amount of the light to accumulate the generated charges.

The transfer transistor 25 is driven according to a transfer signal supplied from the vertical driving unit 13 through the horizontal signal line 22, and when the transfer transistor 25 is turned ON, the charges accumulated in the PD 24 are transferred to the FD 26.

The FD 26 is a floating diffusion region having a predetermined capacity, which is formed at a connection portion between the transfer transistor 25 and a gate electrode of the amplification transistor 27, and accumulates charges transferred from the PD 24 through the transfer transistor 25.

The amplification transistor 27 is connected to a power potential VDD, and outputs a pixel signal of a level corresponding to charges accumulated in the FD 26 to the vertical signal line 23 through the selection transistor 28.

The selection transistor 28 is driven according to a selection signal supplied from the vertical driving unit 13 through the horizontal signal line 22, and when the selection transistor 28 is turned ON, the pixel signal output from the amplification transistor 27 is in a state capable of being output to the vertical signal line 23.

The reset transistor 29 is driven according to a reset signal supplied from the vertical driving unit 13 through the horizontal signal line 22, and when the reset transistor 29 is turned ON, the charges accumulated in the FD 26 are discharged to the power potential VDD and the FD 26 is reset.

In addition, in the imaging device 11 illustrated in FIG. 1, although a circuit configuration is adopted in which the selection of the pixel 21 which outputs the pixel signal is performed by the selection transistor 28, a circuit structure (so-called, three-transistor structure) in which the selection transistor 28 is omitted can be employed. Further, the imaging device 11 can adopt a pixel sharing structure in which the PDs 24 and the transfer transistors 25 of a predetermined number share the FD 26, the amplification transistor 27, the selection transistor 28, and the reset transistor 29.

Figure 2:
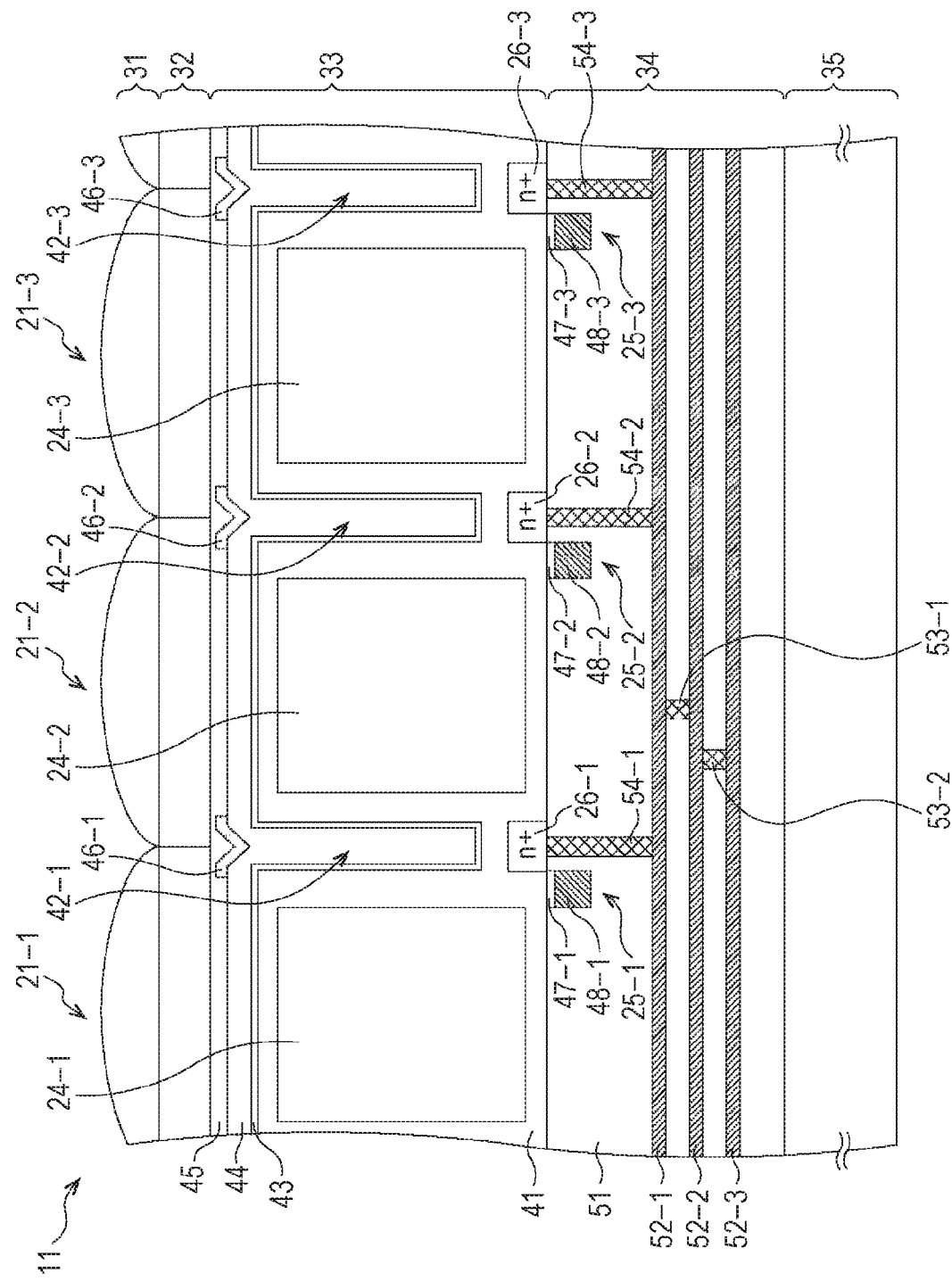
FIG. 2 is a diagram illustrating a cross-sectional configuration example of the imaging device.

FIG. 2 is a diagram illustrating a cross-sectional configuration example of the imaging device 11. Further, FIG. 2 illustrates a cross-sectional view of a vicinity of three pixels 21-1 to 21-3 included in the imaging device 11.

The imaging device 11 performs imaging by light applied from the upper part of the FIG. 2, and is configured with an on-chip lens 31, a color filter 32, a light receiving layer 33, a multilayer wiring layer 34, and a supporting substrate 35, which are laminated in order from the upper part. In other words, the imaging device 11 is a so-called back surface irradiation type CMOS solid-state imaging device in which light is applied from a back surface side which is opposite to a front surface, assuming the front surface is a surface on which the multilayer wiring layer 34 is formed on the light receiving layer 33.

The on-chip lens 31 is formed of a small lens disposed for each of the pixels 21-1 to 21-3, and condenses light applied to the imaging device 11 to each of the PDs 24-1 to 24-3 of the pixels 21-1 to 21-3.

The color filter 32 is formed by disposing a filter which transmits light of a predetermined color in each of the pixels 21-1 to 21-3, and causes the light of corresponding color, among light beams applied to the imaging device 11, to be applied to the PDs 24-1 to 24-3 of pixels 21-1 to 21-3.

In the light receiving layer 33, for example, the PDs 24-1 to 24-3, the transfer transistors 25-1 to 25-3, and the FDs 26-1 to 26-3 are formed for each of the pixels 21-1 to 21-3, on a semiconductor substrate 41 made from a silicon wafer. Then, in the light receiving layer 33, trenches 42-1 to 42-3 are formed so as to separate the pixels 21-1 to 21-3, and a fixed charge film 43, an insulating film 44, and a planarizing film 45 are laminated. Further, in the light receiving layer 33, light shielding portions 46-1 to 46-3 are formed between the insulating film 44 and the planarizing film 45.

The PDs 24-1 to 24-3 are configured to be formed in such a manner that a P-type region and an N-type region are joined in the inside of the semiconductor substrate 41, and receive light which is condensed by the on-chip lens 31 and passed through the color filter 32 so as to generate charges corresponding to the amount of the light.

The transfer transistors 25-1 to 25-3 are respectively configured to have gate electrodes 48-1 to 48-3 which are laminated on the front surface (a surface facing the lower part of FIG. 2) of the semiconductor substrate 41 through the insulating films 47-1 to 47-3. The transfer transistors 25-1 to 25-3 are respectively disposed between the PDs 24-1 to 24-3 and the FDs 26-1 to 26-3. Then, if the transfer signals supplied to the gate electrodes 48-1 to 48-3 are at a high level, the charges accumulated in the PDs 24-1 to 24-3 are transferred to the FDs 26-1 to 26-3 through the corresponding transfer transistors 25-1 to 25-3.

The FDs 26-1 to 26-3 are dense N-type regions which are formed so as to be in contact with the front surface of the semiconductor substrate 41, and accumulates the charges transferred from the corresponding PDs 24-1 to 24-3.

The trenches 42-1 to 42-3 are recessed portions which are formed between the PDs 24-1 to 24-3 so as to be opened in the back surface (a surface facing the upper part of FIG. 2) which is a light receiving surface of the semiconductor substrate 41.

The fixed charge film 43 is a film having negative fixed charges which is provided in order not to deplete a silicon layer near the boundary surface in the back surface of the semiconductor substrate 41, and is formed along the shape of the back surface of the semiconductor substrate 41.

The insulating film 44 has an insulating property, and fills the inside of the trenches 42-1 to 42-3 while being laminated on the back surface of the semiconductor substrate 41.

The planarizing film 45 is a film for planarizing a surface in which the light shielding portions 46-1 to 46-3 are formed in order to laminate the color filter 32 on the light receiving layer 33.

The light shielding portions 46-1 to 46-3 shield the light incident on the pixels 21-1 to 21-3 in an oblique direction, thereby preventing color mixing between adjacent pixels 21-1 to 21-3 due to the light incident in the oblique direction. For example, the light shielding portion 46-1 shields the light directing the adjacent pixel 21-1 from the pixel 21-2 in the oblique direction, and prevents the light from transmitting through the color filter 32 of the pixel 21-2 and entering the PD 24-1 of the pixel 21-1.

Further, the light shielding portions 46-1 to 46-3 are formed into a convex shape protruding to the semiconductor substrate 41 side in order to improve the light shielding property. Further, the light shielding portions 46-1 to 46-3 are formed into lengths sufficient for preventing the leading ends from entering the trenches 42-1 to 42-3. In other words, the leading ends of the light shielding portions 46-1 to 46-3 protruding to the semiconductor substrate 41 side are formed so as to not enter the trenches 42-1 to 42-3 formed on the semiconductor substrate 41.

The multilayer wiring layer 34 is configured in such a manner that a plurality of layers of wirings constituting, for example, the horizontal signal line 22 and the vertical signal line 23 of FIG. 1 are laminated between the inter-layer insulating films 51, and in the configuration example of FIG. 2, three layers of wirings 52-1 to 52-3 are laminated. Further, through electrodes 53-1 and 53-2 which connect wirings 52-1 to 52-3 to each other and through electrodes 54-1 to 54-3 which connect the FDs 26-1 to 26-3 and the wiring 42-1 are formed on the multilayer wiring layer 34.

The supporting substrate 35 is a base for ensuring the strength of the light receiving layer 33 formed as a thin film and supporting the light receiving layer 33.

The imaging device 11 is configured in this manner and the light shielding portion 46 shields light incident in an oblique direction, thereby preventing the light from leaking to other adjacent pixels 21 and suppressing the occurrence of color mixing. For example, in a configuration in which the light shielding portion is formed in a plane manner, in an insulating film portion of an upper layer, it is assumed that obtaining a sufficient light shielding property is difficult and suppression of the color mixing is insufficient. In contrast, in the imaging device 11, the light shielding portion 46 is formed into a convex shape protruding to the semiconductor substrate 41 side, such that even in the configuration in which the light shielding portion is formed in a plane manner, it is possible to improve light shielding property with respect to the light incident in the oblique direction. Thus, the imaging device 11 can more reliably suppress the occurrence of color mixing.

Further, for example, in the configuration in which the light shielding portion 46 extends to the inside of the trench 42, there is a concern that a dark current and white spots are exacerbated due to deterioration in interface characteristics. In contrast, in the imaging device 11, since the light shielding portions 46-1 to 46-3 are formed so as to not enter the trenches 42-1 to 42-3, it is possible to make improvements for the dark current and white spots, and to avoid degradation in image quality.

Further, since the imaging device 11 performs the element isolation between pixels 21 by filling the trench 42 with the insulating film 44, for example, even in a configuration in which the element isolation is performed by ion implantation and annealing, it is possible to more reliably perform the element isolation. Thus, it is possible to reliably prevent color mixing even if a pixel isolation region with a narrow width is formed in response to miniaturization of the imaging device 11. Further, it is possible to increase a capacity of the PD 24 in particular, and to increase the capacity of the PD 24 in a blue region in the vicinity of a light receiving surface in the imaging device 11, thereby increasing a saturation signal amount and improving a dynamic range.

Next, a manufacturing method of the imaging device 11 will be described with reference to FIGS. 3 to 11.

Figure 3:
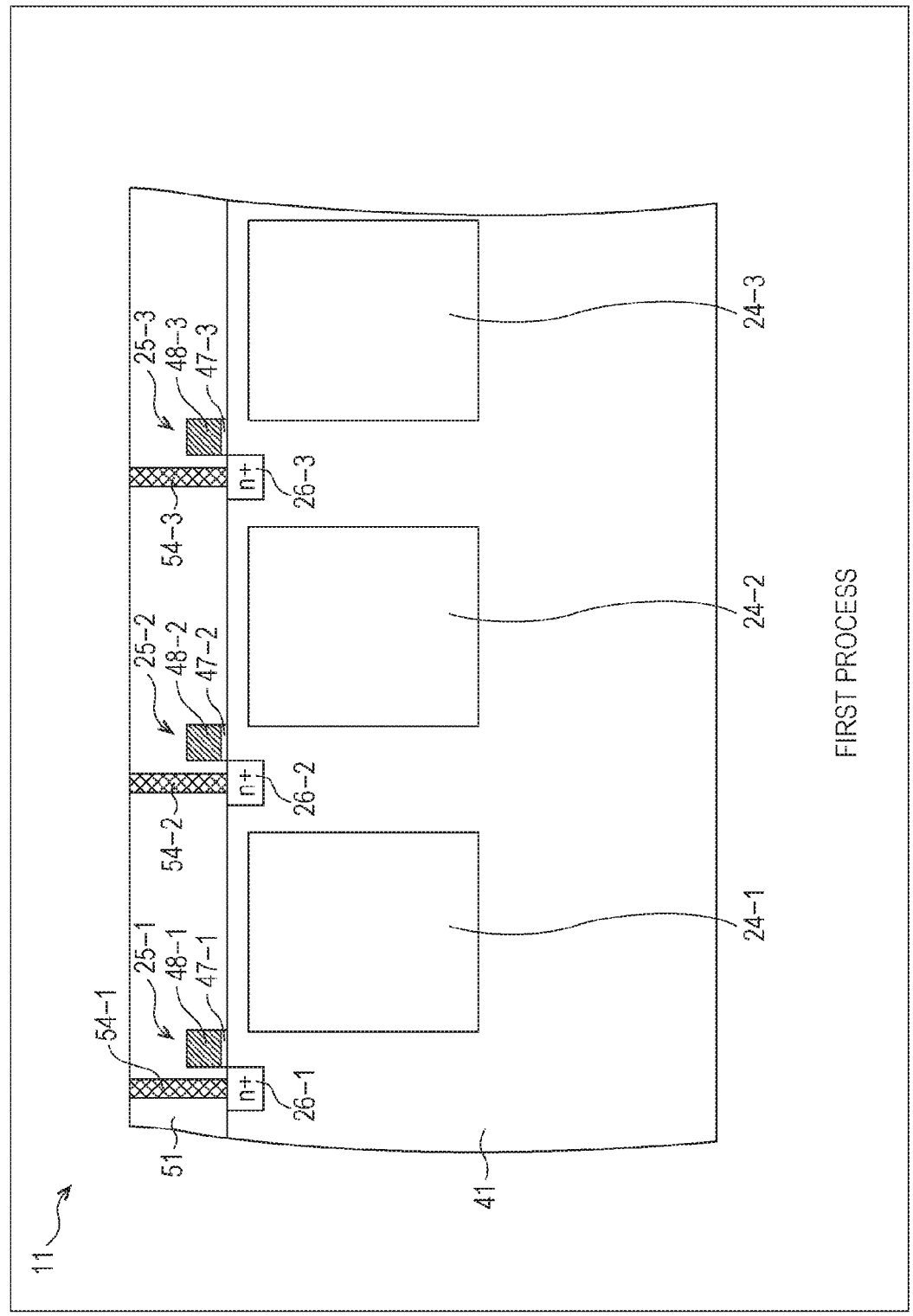
FIG. 3 is a diagram illustrating a first process of manufacturing the imaging device.

In a first process, as illustrated in FIG. 3, PDs 24-1 to 24-3 and FDs 26-1 to 26-3 are formed by ion implantation performed on the front surface side (upper part of FIG. 3) of the semiconductor substrate 41. Thereafter, transfer transistors 25-1 to 25-3 are formed by laminating the insulating films 47-1 to 47-3 and the gate electrodes 48-1 to 48-3 on the front surface of the semiconductor substrate 41. In addition, without being illustrated, the other transistors, that is, the amplification transistor 27, the selection transistor 28, and the reset transistor 29 in FIG. 1 are also formed in the same manner as in the transfer transistor 25.

Then, after an inter-layer insulating film 51 is laminated, contact holes are formed on the inter-layer insulating film 51, and through electrodes 54-1 to 54-3 are formed at the contact holes so as to be connected to respective FDs 26-1 to 26-3. In addition, in the same manner, a through electrode (not illustrated) for supplying a transfer signal is formed so as to be connected to the gate electrodes 48-1 to 48-3.

Figure 4:
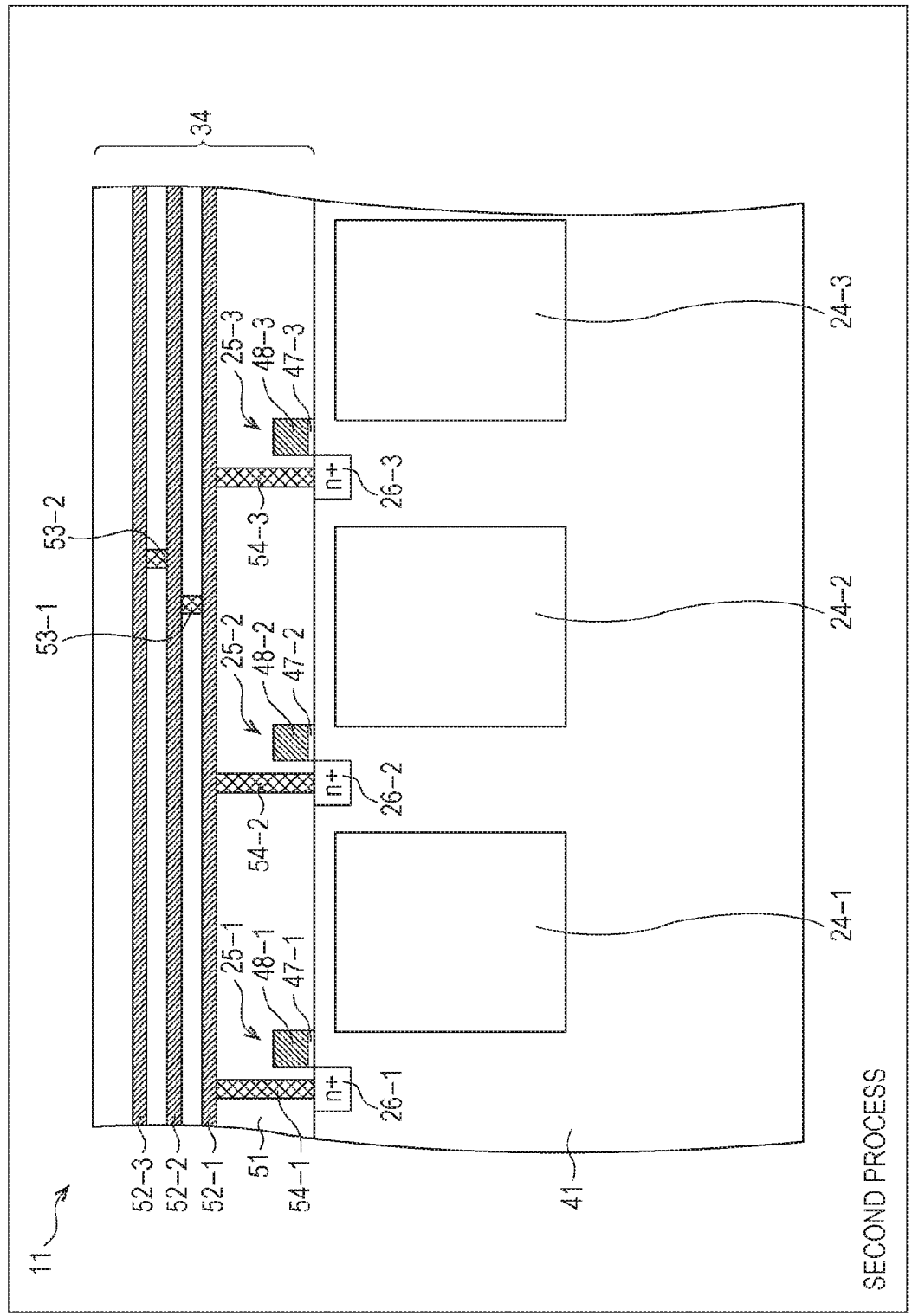
FIG. 4 is a diagram illustrating a second process of manufacturing the imaging device.

In a second process, as illustrated in FIG. 4, the multilayer wiring layer 34 is formed by the wirings 52-1 to 52-3 and the through electrodes 53-1 and 53-2 are formed so as to be respectively insulated by the inter-layer insulating film 51.

In other words, the multilayer wiring layer 34 is formed through the following manner: after the wiring 52-1 is formed on the inter-layer insulating film 51 laminated in the first process, the inter-layer insulating film 51 is laminated and the through electrode 53-1 is formed so as to form the wiring 52-2 on the inter-layer insulating film 51, and further, the inter-layer insulating film 51 is laminated and the through electrode 53-2 is formed so as to form the wiring 52-3 on the inter-layer insulating film 51, and then the inter-layer insulating film 51 is further laminated.

Figure 5:
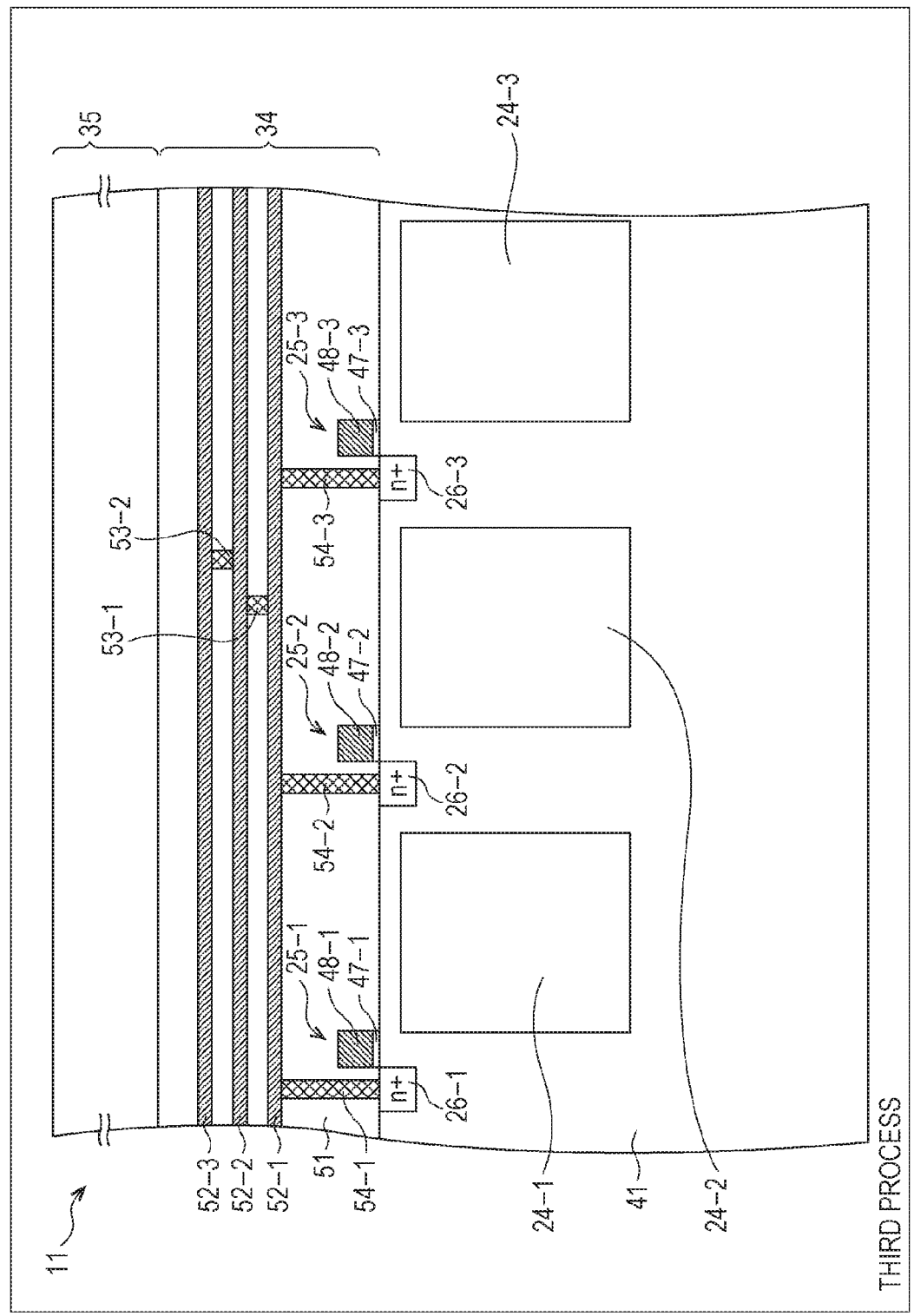
FIG. 5 is a diagram illustrating a third process of manufacturing the imaging device.

In a third process, as illustrated in FIG. 5, the supporting substrate 35 is bonded to the multilayer wiring layer 34 from the top of the multilayer wiring layer 34.

Figure 6:
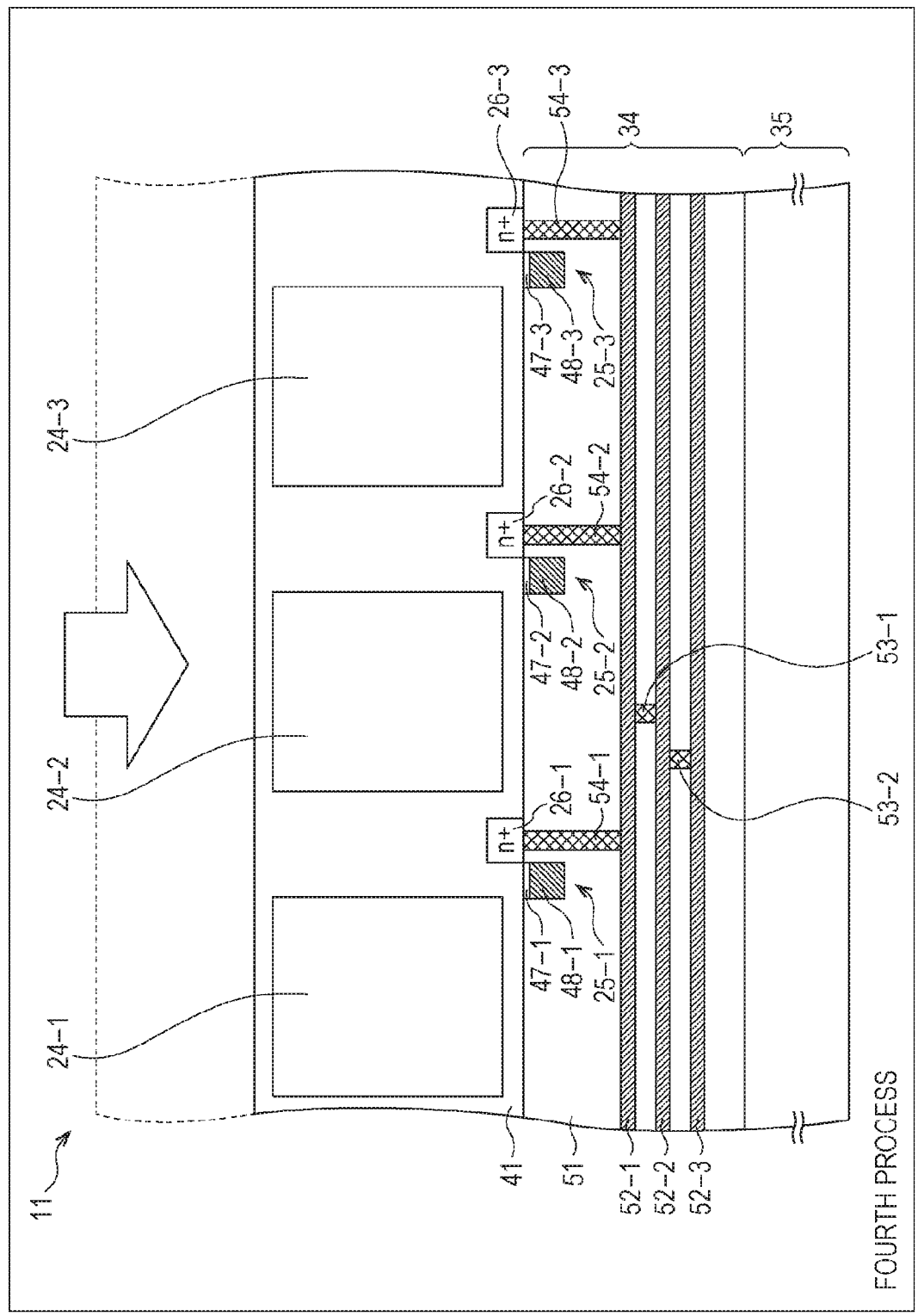
FIG. 6 is a diagram illustrating a fourth process of manufacturing the imaging device.

In a fourth process, as illustrated in FIG. 6, the back surface side of the semiconductor substrate 41 is inverted to face upward, and the back surface side of the semiconductor substrate 41 is scraped off with high accuracy until the semiconductor substrate 41 has a desired film thickness; for example, the bottom of a vertical type transistor which is not shown is exposed. For example, a Chemical Mechanical Polishing (CMP) method, a dry etching, a wet etching, or the like can be used for the process, and a combination of these methods can also be used.

Figure 7:
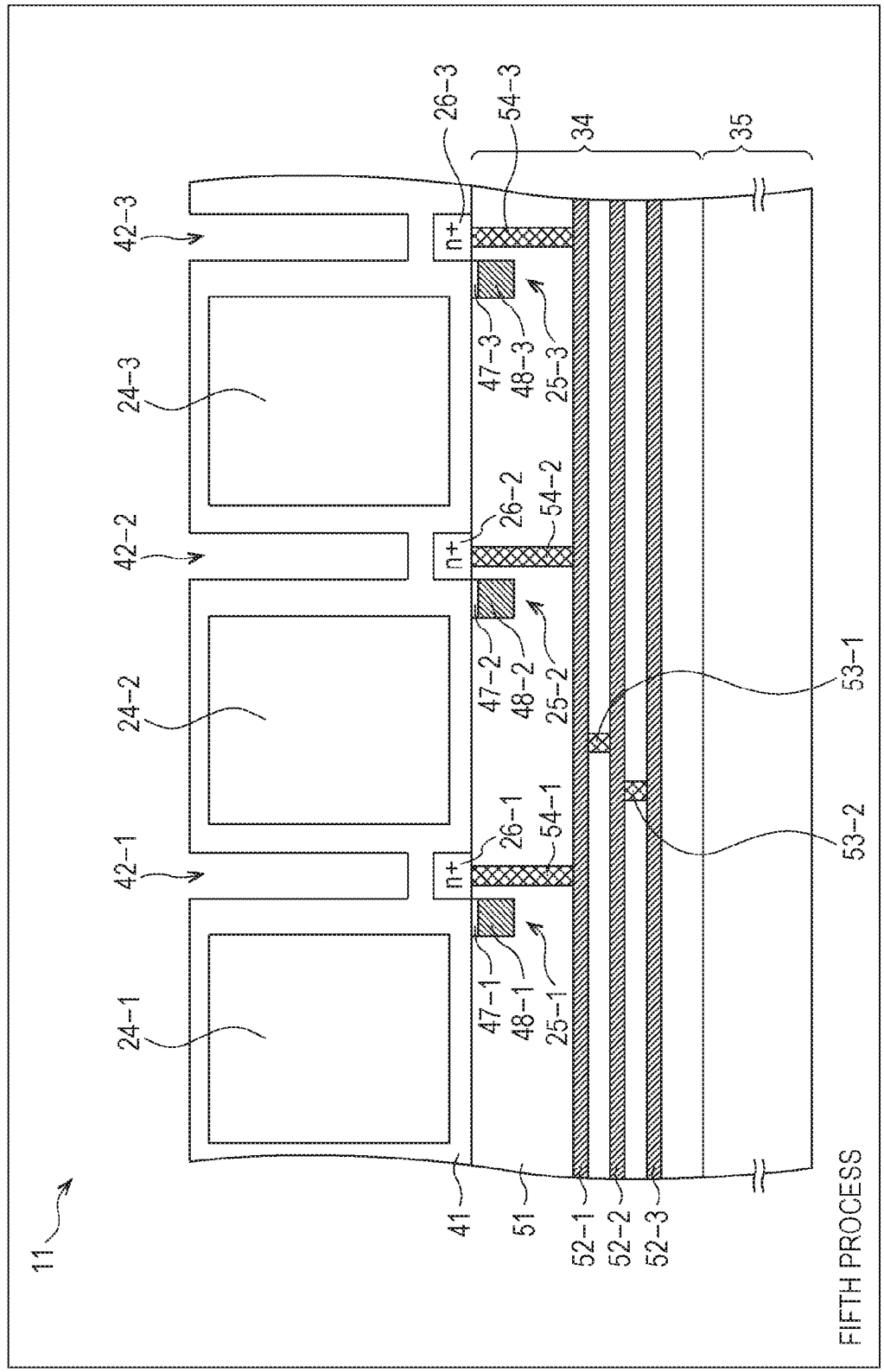
FIG. 7 is a diagram illustrating a fifth process of manufacturing the imaging device.

In a fifth process, as illustrated in FIG. 7, the trenches 42-1 to 42-3 are formed in an element isolation region between respective PDs 24-1 to 24-3 at a predetermined depth, for example, at a depth of about 2 μm from the back surface of the semiconductor substrate 41. For example, the dry etching can be used in forming the trenches 42-1 to 42-3.

Figure 8:
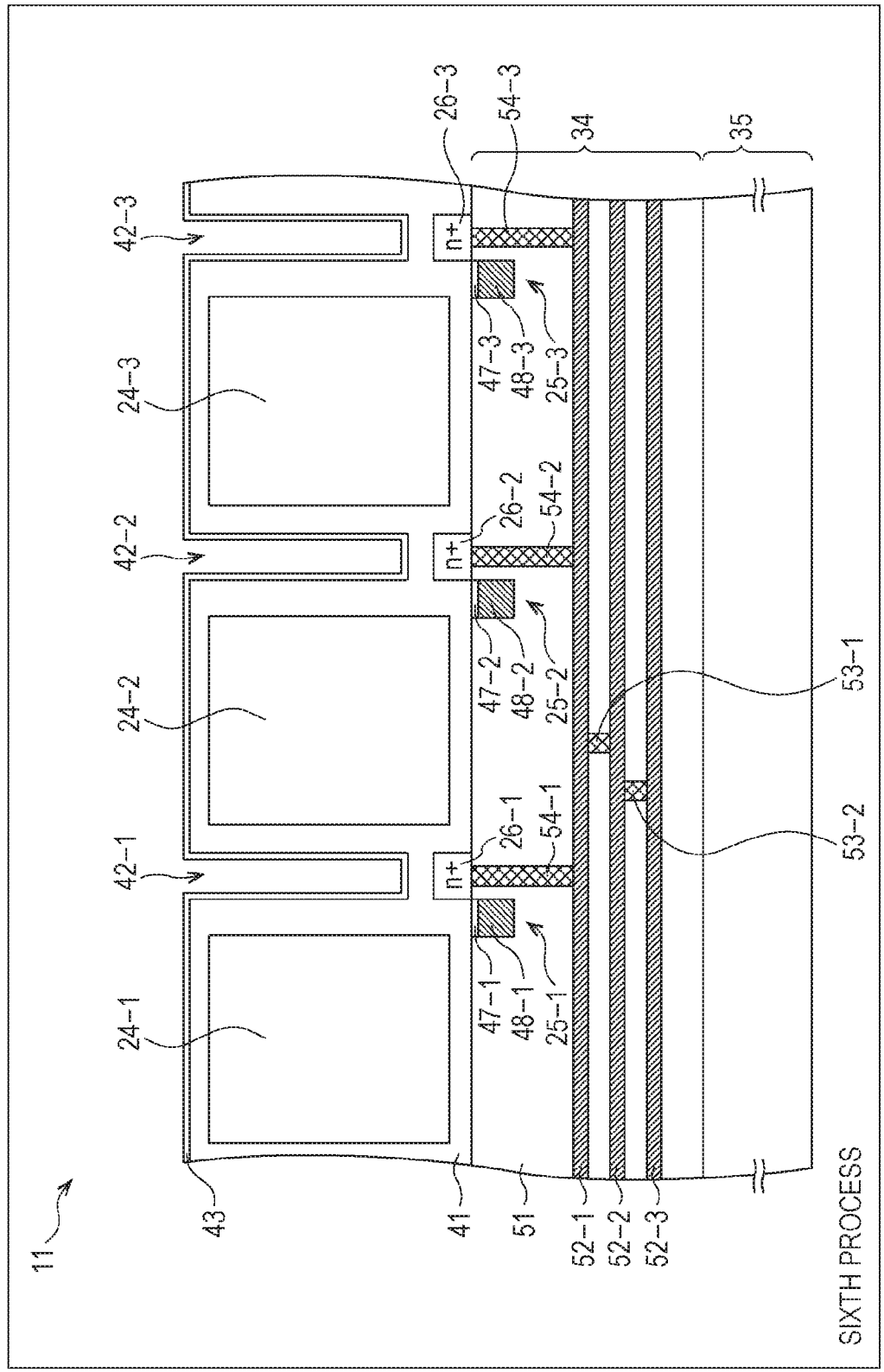
FIG. 8 is a diagram illustrating a sixth process of manufacturing the imaging device.

In a sixth process, as illustrated in FIG. 8, a fixed charge film 43 is formed along the shape of the back surface of the semiconductor substrate 41. In other words, the fixed charge film 43 is formed not only on the back surface of the semiconductor substrate 41 but also on the side surfaces and the bottom surfaces of the trenches 42-1 to 42-3 formed in the semiconductor substrate 41. Further, for example, a HfO2 (hafnium oxide) film formed by an Atomic Layer Deposition (ALD) method can be used as the fixed charge film 43.

Figure 9:
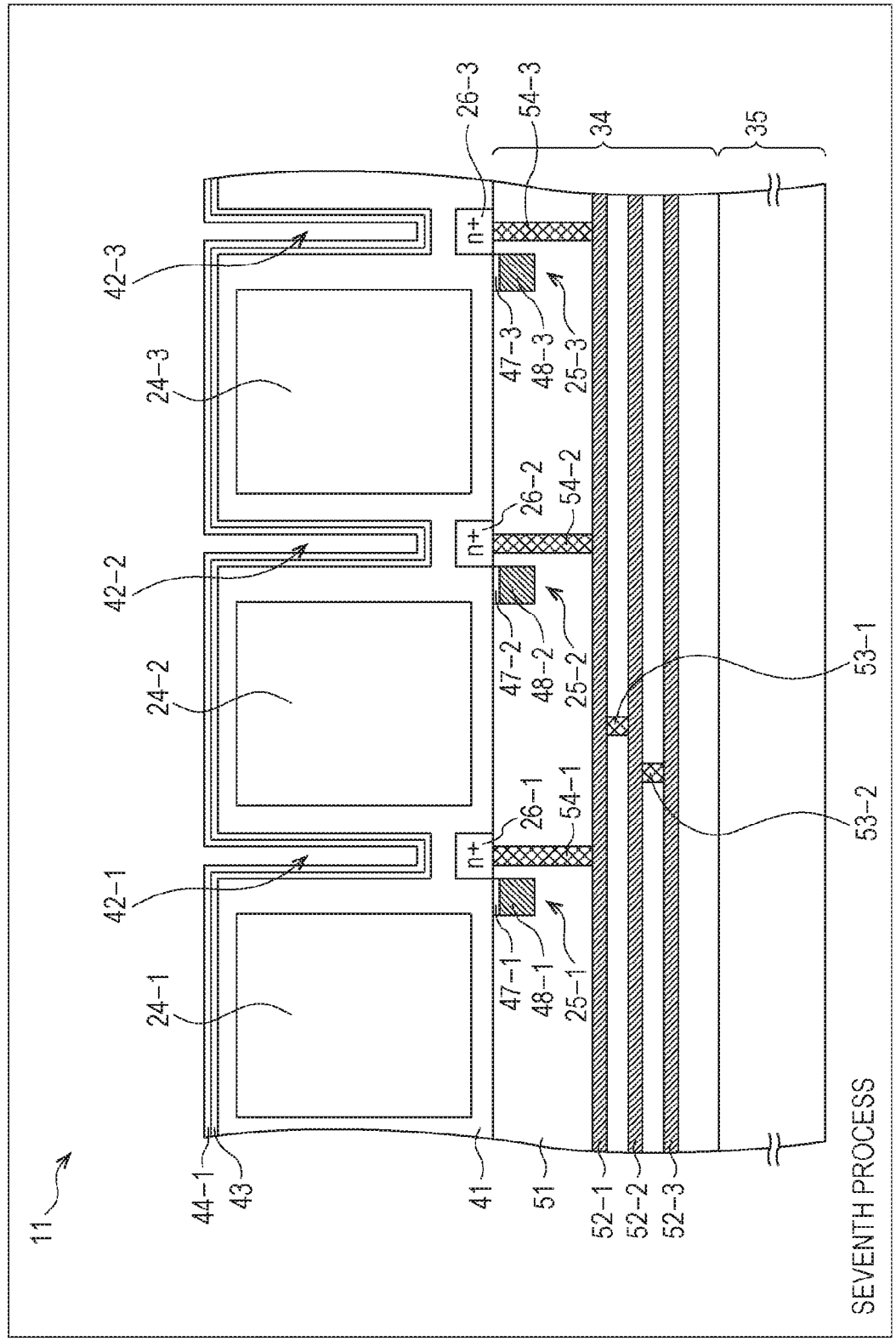
FIG. 9 is a diagram illustrating a seventh process of manufacturing the imaging device.
Figure 10:
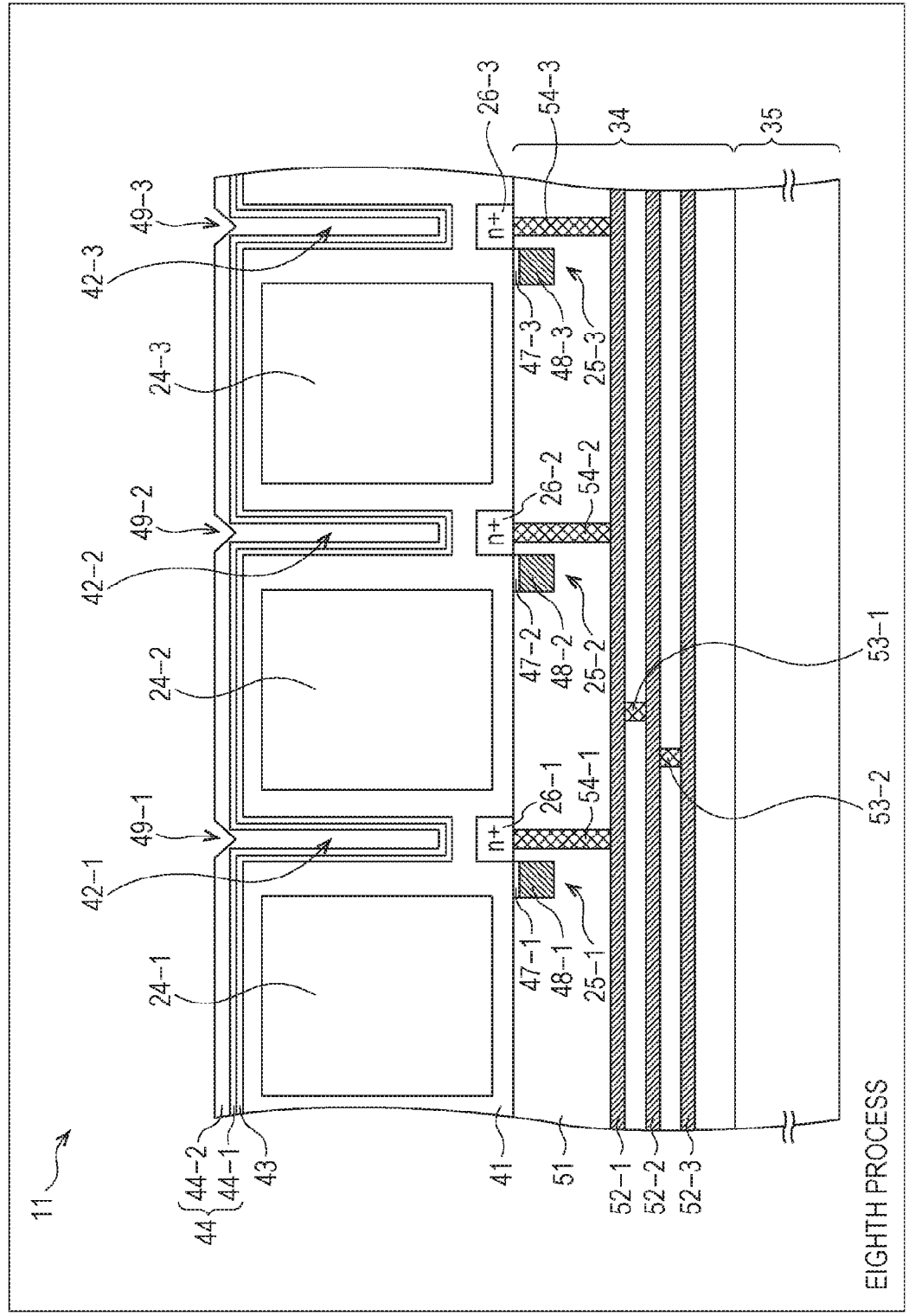
FIG. 10 is a diagram illustrating an eighth process of manufacturing the imaging device.

In seventh and eighth processes, as illustrated in FIG. 9 and FIG. 10, an insulating film 44 is formed so as to be embedded in the trenches 42-1 to 42-3. Further, a film forming method of forming the concave portions 49-1 to 49-3 in which the back surface of the insulating film 44 is concave as a V-shape, depending on the locations of trenches 42-1 to 42-3, is adopted in forming the insulating film 44. For example, the concave portions 49-1 to 49-3 are formed by forming the insulating film 44 as a two-layer structure (laminated structure) in which after an SiO2 film is formed by the ALD method, an oxide film is formed by a High Density Plasma (HDP)

In other words, in the seventh process, as illustrated in FIG. 9, an insulating film 44-1 is formed by the ALD method, and in the eighth process, as illustrated in FIG. 10, an insulating film 44-2 is formed by the HDP. Since the film formation and the sputtering are simultaneously performed in the film formation by the HDP, as illustrated in FIG. 10, the concave portions 49-1 to 49-3 of substantially V-shape linearly cutting into shoulder portions of the trenches 42-1 to 42-3 are formed.

Figure 11:
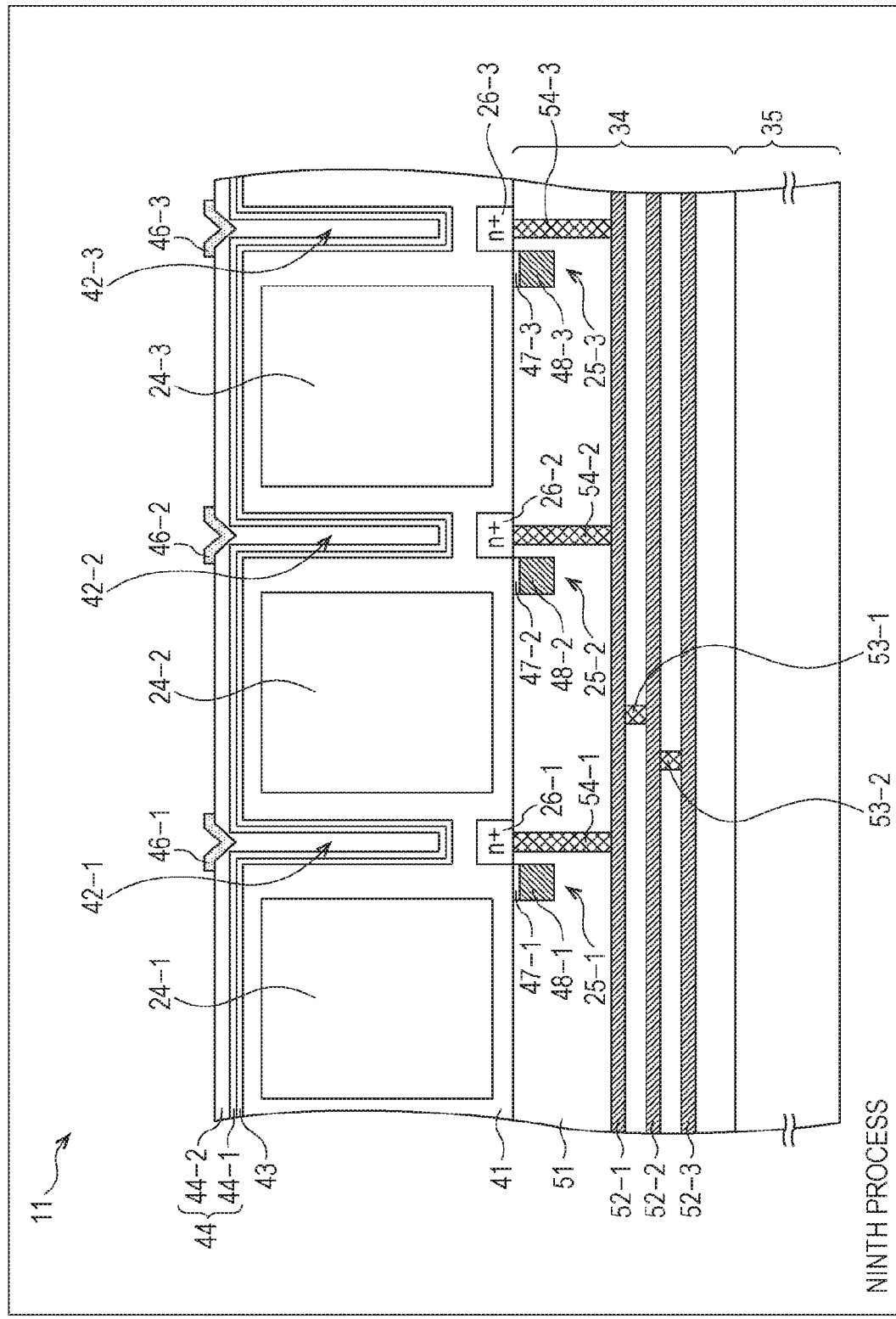
FIG. 11 is a diagram illustrating a ninth process of manufacturing the imaging device.

In a ninth process, as illustrated in FIG. 11, light shielding portions 46-1 to 46-3 are formed for the insulating film 44, depending on locations at which the trenches 42-1 to 42-3 are formed. In other words, as illustrated in FIG. 10, the concave portions 49-1 to 49-3 are formed on the insulating film 44, depending on locations at which the trenches 42-1 to 42-3 are formed, and the light shielding portions 46-1 to 46-3 are formed along the shape of the front surface of the concave portions 49-1 to 49-3. Accordingly, the light shielding portions 46-1 to 46-3 is formed so as to have a convex shape protruding to the semiconductor substrate 41 in such a manner that the cross sectional shape is a substantially V-shape.

For example, the light shielding portions 46-1 to 46-3 are formed by performing a process of removing parts other than the locations which are required for a light shielding structure after metal films forming the light shielding portions 46-1 to 46-3 are formed by a sputtering method or a CVD method. Further, a laminated film of titanium (Ti) and tungsten (W), or a laminated film of titanium nitride (TiN) and tungsten (W) can be used as the light shielding portions 46-1 to 46-3. Further, the insulating film 44 is formed so as to fill the inside of the trench 42, which prevents the leading end of the light shielding portion 46 from entering the trench 42.

Thereafter, as illustrated in FIG. 2, the light receiving layer 33 is formed by laminating the planarizing film 45, and the imaging device 11 is manufactured by laminating the color filter 32 and the on-chip lens 31 on the light receiving layer 33.

As described above, in the imaging device 11, the trench 42 is formed so as to perform element isolation between the PDs 24, thereby allowing the insulating film 44 to be formed in such a manner that the concave portion 49 is formed between the PDs 24. Accordingly, it is possible to easily form the light shielding portion 46 having a convex shape protruding to the semiconductor substrate 41 side, using the concave portion 49 of the insulating film 44. Thus, it is possible to manufacture the imaging device 11 capable of reliably suppressing the occurrence of color mixing.

In addition, the cross sectional shapes of the light shielding portions 46-1 to 46-3 may have shapes other than the substantially V-shape as illustrated in FIG. 2. For example, it is possible to vary the shapes of the concave portions 49-1 to 49-3 of the insulating film 44 by a film forming method, and to make the cross-sectional shapes of the light shielding portions 46-1 to 46-3 have shapes other than the substantially V-shape, depending on the shapes of the concave portions 49-1 to 49-3.

A first modified example of the imaging device 11 will be described with reference to FIG. 12. In addition, in an imaging device 11' illustrated in FIG. 12, the illustration of the on-chip lens 31, the color filter 32, the multilayer wiring layer 34, and the supporting substrate 35 is omitted.

Figure 12:
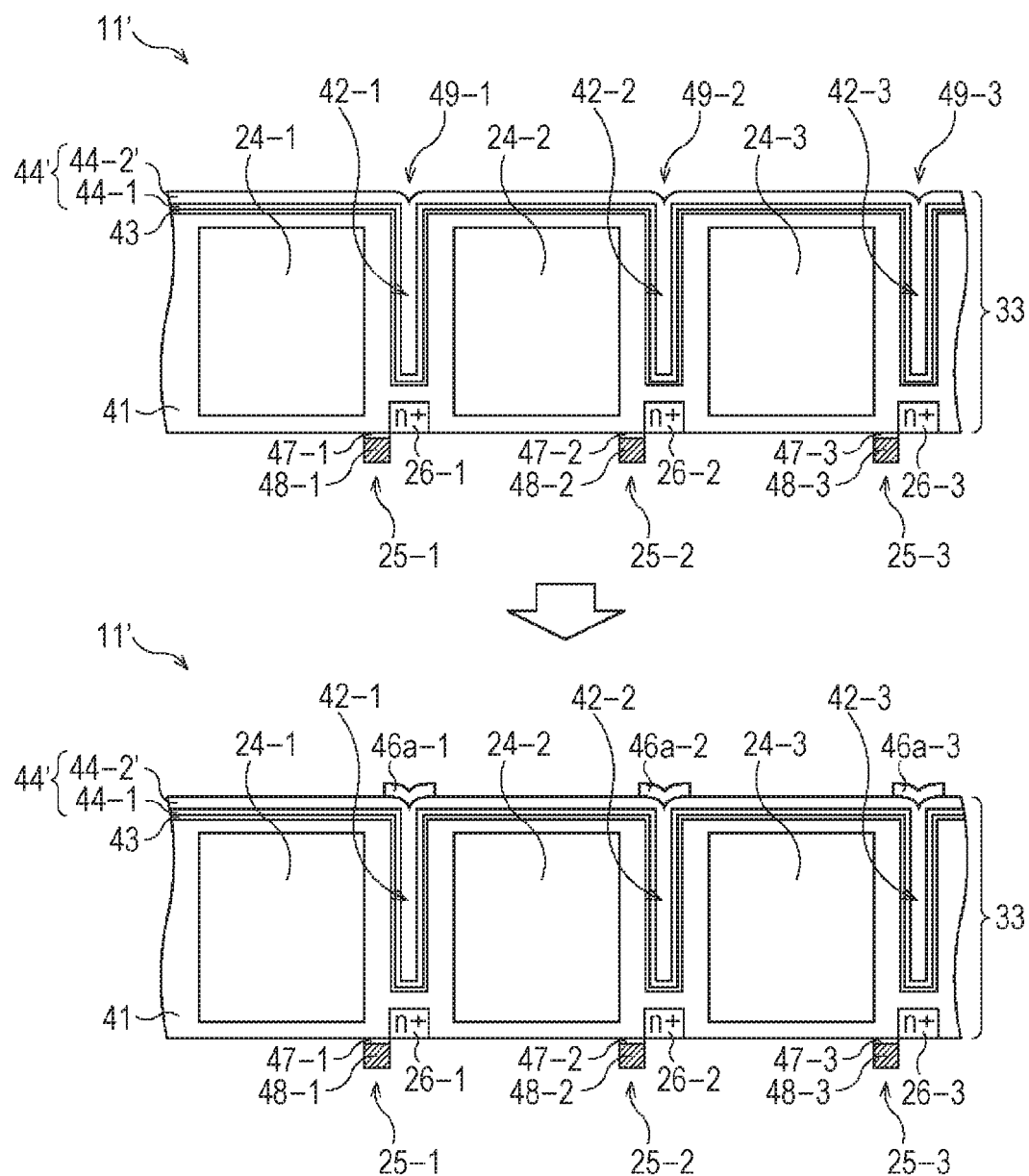
FIG. 12 is a diagram illustrating a first modified example of the imaging device.

For example, as illustrated in FIG. 9, in the seventh process, after the insulating film 44-1 is formed by the ALD method, as illustrated in the upper part of FIG. 12, in the eighth process, an insulating film 44' is formed by forming an insulating film 44-2' by a Plasma Tetra Ethyl Oxysilane (P-TEOS). In the film formation by the P-TEOS, the concave portions 49-1 to 49-3 are formed into a shape in which the front surface is concave in a curved shape so as to have a steep slope to the center.

Accordingly, thereafter, in the ninth process, when light shielding portions 46a-1 to 46a-3 are formed along the front surface shapes of the concave portions 49-1 to 49-3, as illustrated in the lower part of FIG. 12, the cross-sectional shape is formed in such a manner that the upper and lower surfaces have a convex shape protruding to the semiconductor substrate 41 in a curved shape.

In this manner, it is possible to form the light shielding portions 46-1 to 46-3 in a desired shape by the film formation method of the insulating film 44.

In addition, the structure of the insulating film 44 is not limited to a configuration example (refer to FIG. 9 and FIG. 10) in which the insulating film 44-2 formed by the HDP is laminated on the insulating film 44-1 formed by the ALD method and a configuration example (refer to FIG. 12) in which the insulating film 44-2' formed by the P-TEOS is laminated on the insulating film 44-1 formed by the ALD method. In other words, if light shielding portion 46 can be formed into a convex shape protruding to the semiconductor substrate 41, it is possible to adopt structures other than the configuration examples as the structure of the insulating film 44. For example, as the structure of the insulating film 44, a configuration in which an insulating film formed by the ALD method is laminated on the insulating film formed by the P-TEOS, a configuration of a single film formed by the P-TEOS, or a configuration of a single film formed by the ALD method may be adopted.

Further, the light shielding portions 46-1 to 46-3 may be formed, for example, in such a manner that after the insulating film 44 is formed to be planarized, recessed portions are formed depending on locations at which the trenches 42-1 to 42-3 are formed, and the insulating film is embedded in the recessed portion.

Figure 13:
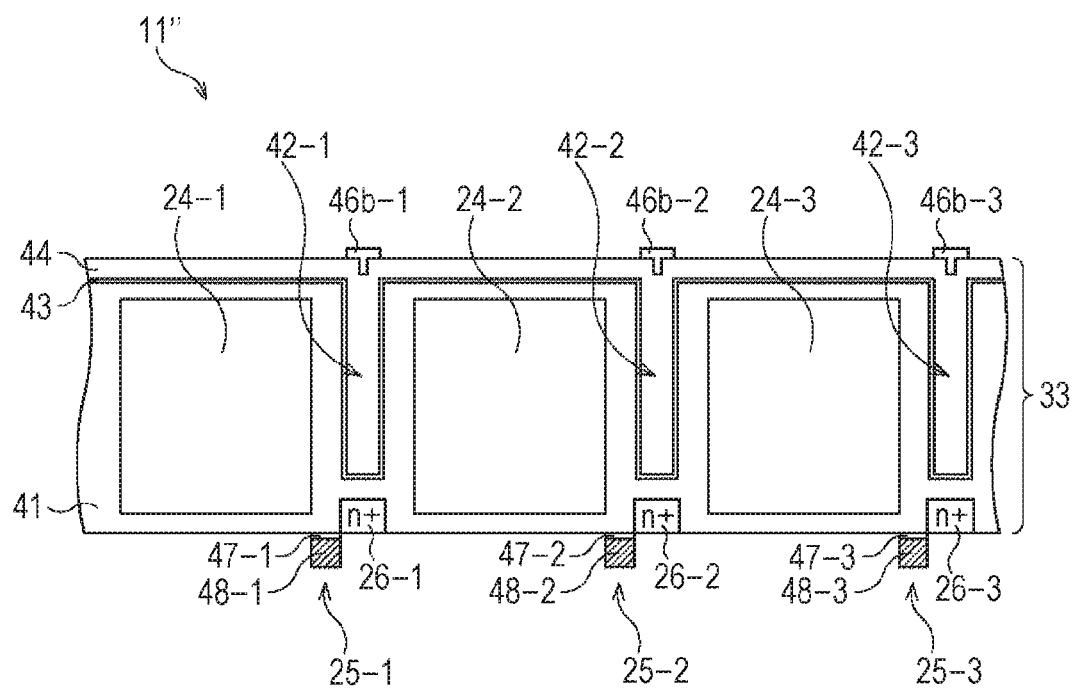
FIG. 13 is a diagram illustrating a second modified example of the imaging device.

In other words, FIG. 13 illustrates a second modified example of the imaging device 11. In addition, in an imaging device 11" illustrated in FIG. 13, the illustration of the on-chip lens 31, the color filter 32, the multilayer wiring layer 34, and the supporting substrate 35 is omitted.

As illustrated in FIG. 13, light shielding portions 46b-1 to 46b-3 are formed into cross-sectional shapes of a T-shape, depending on the recessed portions formed in the insulating film 44.

In this manner, the light shielding portions 46-1 to 46-3 can be formed into any cross-sectional shape of a convex shape protruding to the semiconductor substrate 41, so as to obtain a better light shielding property.

Further, the imaging device 11 described above can be applied to various electronic apparatuses including imaging systems such as digital still cameras and digital video cameras, mobile phones with an imaging function, or other apparatuses with an imaging function.

Figure 14:
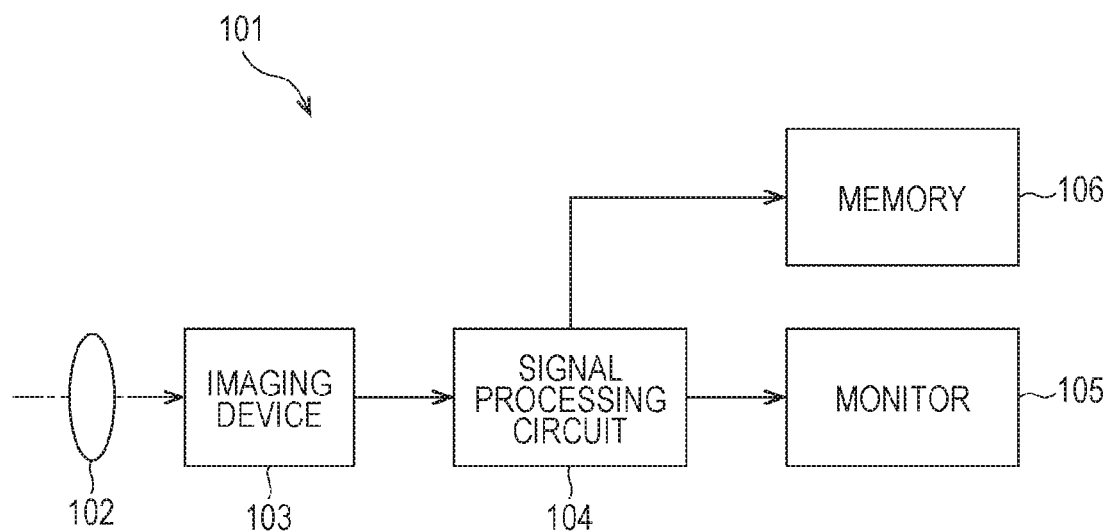
FIG. 14 is a block diagram illustrating a configuration example of an imaging apparatus mounted on an electronic apparatus.

FIG. 14 is a block diagram illustrating a configuration example of an imaging apparatus mounted on an electronic apparatus.

As illustrated in FIG. 14, an imaging apparatus 101 is configured to include an optical system 102, an imaging device 103, a signal processing circuit 104, a monitor 105, and a memory 106, and is capable of capturing still images and moving images.

The optical system 102 is configured to include one or a plurality of lenses, and guides image light (incident light) from an object to the imaging device 103 so as to form an image on a light receiving surface (sensor unit) of the imaging device 103.

As the imaging device 103, the imaging devices 11 of the configuration examples and the modified examples described above are applied. Electrons are accumulated in the imaging device 103 for a fixed period, according to an image formed on the light receiving surface through the optical system 102. Thus, signals according to the electrons accumulated in the imaging device 103 are supplied to the signal processing circuit 104.

The signal processing circuit 104 performs various signal processes on the signal charges which are output from the imaging device 103. The image (image data) obtained by the signal processing circuit 104 performing the signal processes is supplied to and displayed on the monitor 105, or is supplied to and stored (recorded) in the memory 106.

In the imaging apparatus 101 configured in this manner, it is possible to obtain a good quality image in which the occurrence of color mixing is suppressed, by applying the imaging device 11 of the configuration examples or the modified examples as described above as the imaging device 103.

In addition, the imaging device 11 can also be applied to a front surface irradiation type CMOS solid-state imaging device in which incidence light is applied from a front surface side on which the multilayer wiring layer 34 is formed on the light receiving layer 33, and the light shielding portion 46 is formed between the light receiving layer 33 and the multilayer wiring layer 34.

In addition, the present technology may have the following configurations.

(1)
A solid-state imaging device including:
a semiconductor substrate on which a plurality of photoelectric conversion units, each of which receives light to generate charges, are formed;
a recessed portion that is formed between the photoelectric conversion units so as to be opened to a light receiving surface side of the semiconductor substrate;
an insulating film which is embedded in the recessed portion and laminated on the back surface side of the semiconductor substrate; and
a light shielding portion that is laminated on the insulating film and is formed into a convex shape protruding to the semiconductor substrate at a location corresponding to the recessed portion.

(2)
The solid-state imaging device according to (1),
in which the light shielding portion is formed into a length sufficient to prevent a leading end on the semiconductor substrate side from entering the recessed portion.

(3)
The solid-state imaging device according to (1) or (2),
in which when the insulating film is formed, a concave portion in which a surface of the insulating film is concave is formed, depending on a location of the recessed portion.

(4)
The solid-state imaging device according to any one of (1) to (3),
in which the insulating film is configured as a laminated structure in which a plurality of layers are laminated.

(5)
The solid-state imaging device according to any one of (1) to (4),
in which with respect to the light receiving surface of the semiconductor substrate in which the recessed portion is formed, after a fixed charge film having negative fixed charges is formed, the insulating film is formed.

(6)
The solid-state imaging device according to any one of (1) to (5),
in which light is applied to a back surface which is a side opposite to a front surface on which a wiring layer is laminated on the semiconductor substrate.

In addition, the present embodiments are not limited to the embodiments described above, and various modifications are possible without departing from the scope of the present disclosure.

REFERENCE SIGNS LIST

11 IMAGING DEVICE
12 PIXEL ARRAY UNIT
13 VERTICAL DRIVING UNIT
14 COLUMN PROCESSING UNIT
15 HORIZONTAL DRIVING UNIT
16 OUTPUT UNIT
17 DRIVING CONTROL UNIT
21 PIXEL
22 HORIZONTAL SIGNAL LINE
23 VERTICAL SIGNAL LINE
24 PD
25 TRANSFER TRANSISTOR
26 FD
27 AMPLIFICATION TRANSISTOR
28 SELECTION TRANSISTOR
29 RESET TRANSISTOR
31 ON-CHIP LENS
32 COLOR FILTER
33 LIGHT RECEIVING LAYER
34 MULTILAYER WIRING LAYER
35 SUPPORTING SUBSTRATE
41 SEMICONDUCTOR SUBSTRATE
42 TRENCH
43 CHARGE FILM
44 INSULATING FILM
45 PLANARIZING FILM
46 LIGHT SHIELDING PORTION
47 INSULATING FILM
48 GATE ELECTRODE
49 CONCAVE PORTION

What is claimed is:

1. An imaging device, comprising:
a semiconductor substrate including:
first and second photoelectric conversion units, and
a trench disposed between the first photoelectric conversion unit and the second photoelectric conversion unit;
an insulating film disposed at a light-receiving side of the semiconductor substrate; and
a light-shielding portion,
wherein,
the first photoelectric conversion unit is adjacent to the second photoelectric conversion unit,
a light-incident side of the insulating film includes a concave portion at a location corresponding to the trench, and
the light-shielding portion is disposed above the concave portion of the insulating film.

2. The imaging device of claim 1, wherein the insulating film is embedded in the trench.

3. The imaging device of claim 1, wherein the concave portion of the insulating film is disposed between the first photoelectric conversion unit and the second photoelectric conversion unit.

4. The imaging device of claim 1, further comprising:
a plurality of transistors, wherein the first and second photoelectric conversion units share at least one transistor included in the plurality of transistors.

5. The imaging device of claim 4, wherein the at least one shared transistor includes a reset transistor positioned to allow charge to be selectively discharged from a floating diffusion to a circuit node.

6. The imaging device of claim 4, wherein the at least one shared transistor includes an amplification transistor coupled to a floating diffusion to allow a signal corresponding to a potential of the floating diffusion to be output to a signal line.

7. The imaging device of claim 4, wherein the at least one shared transistor includes a select transistor positioned to selectively enable operation of an amplification transistor.

8. The imaging device of claim 1, further comprising:
a plurality of transistors including first and second transfer transistors associated with the first and second photoelectric conversion units respectively, wherein the first and second transfer transistors are positioned to allow charge to be selectively transferred to a floating diffusion shared by the first and second photoelectric conversion units.

9. The imaging device of claim 1, further comprising:
an element isolation region disposed between the first and second photoelectric conversion units.

10. The imaging device of claim 1, further comprising:
a plurality of transistors; and
a vertical driving unit, wherein the vertical driving unit is configured to supply drive signals to drive the plurality of transistors.

11. The imaging device of claim 1, further comprising:
a signal line, wherein the signal line is coupled to a select transistor; and
a column processing unit, wherein the column processing unit is coupled to the signal line, and wherein the column processing unit is configured to convert a signal from the at least one of the photoelectric conversion units to a digital signal.

12. The imaging device of claim 11, wherein the column processing unit performs correlated double sampling of the signal.

13. The imaging device of claim 1, wherein the semiconductor substrate includes a first side that is the light-receiving side and a second side, the imaging device further comprising:
a plurality of on-chip lenses arranged at the first side of the semiconductor substrate; and
a color filter disposed between the on-chip lenses and the first side of the semiconductor substrate, wherein the insulating film is disposed between the color filter and the first side of the semiconductor substrate.

14. The imaging device of claim 13, further comprising:
a planarization film disposed between the color filter and the first side of the semiconductor substrate.

15. The imaging device of claim 14, further comprising:
a film disposed between the insulating film and the light-receiving side of the semiconductor substrate.

16. The imaging device of claim 15, wherein the film includes hafnium.

17. The imaging device of claim 1, wherein the semiconductor substrate includes a first side that is the light-receiving side and a second side, the imaging device further comprising:
a metallic portion disposed adjacent to the first side of the semiconductor substrate, wherein the metallic portion forms a light-shielding layer disposed between a color filter and the first side of the semiconductor substrate.

18. The imaging device of claim 17, wherein the light-shielding layer includes at least one of aluminum, tungsten, or copper.

19. The imaging device of claim 1, further comprising:
a support substrate disposed at a side of the semiconductor substrate opposite to the light-receiving side.

20. The imaging device of claim 1, further comprising:
a wiring layer including a plurality of signal lines and disposed at a side of the semiconductor substrate opposite to the light-receiving side.

21. An apparatus, comprising:
an imaging device including:
a semiconductor substrate including:
first and second photoelectric conversion units, and
a trench disposed between the first photoelectric conversion unit and the second photoelectric conversion unit,
an insulating film disposed at a light-receiving side of the semiconductor substrate, and
a light-shielding portion,
wherein,
the first photoelectric conversion unit is adjacent to the second photoelectric conversion unit,
a light-incident side of the insulating film includes a concave portion at a location corresponding to the trench, and
the light-shielding portion is disposed above the concave portion of the insulating film; and
at least one lens configured to direct light to a light-receiving surface of the imaging device.

* * * * *